United States Patent [19]

Ury et al.

[11] Patent Number: 4,885,047

[45] Date of Patent: Dec. 5, 1989

[54] APPARATUS FOR PHOTORESIST STRIPPING

[75] Inventors: Michael G. Ury, Bethesda; John C. Matthews, Gaithersburg; Stuart N. Rounds, Germantown, all of Md.

[73] Assignee: Fusion Systems Corporation, Rockville, Md.

[21] Appl. No.: 141,856

[22] Filed: Jan. 11, 1988

Related U.S. Application Data

[63] Continuation-in-part of Ser. No. 895,102, Aug. 11, 1986.

[51] Int. Cl.⁴ ............... B44C 1/22; B29C 37/00; C03C 15/00; C03C 25/06
[52] U.S. Cl. ........................................ 156/345; 134/1; 134/34; 134/105; 156/643; 156/646; 156/655; 156/668
[58] Field of Search ............... 156/643, 655, 659.1, 156/668, 646, 345; 134/1, 34, 102, 105

[56] References Cited

U.S. PATENT DOCUMENTS 3,890,176 6/1975 Bolon .................................. 134/31 X
4,028,135 6/1977 Vig et al. ............................. 134/1
4,292,384 9/1981 Shraughan et al. ................. 430/5
4,341,592 7/1982 Shortes et al. ...................... 156/643
4,544,446 10/1985 Cady ................................... 156/639

OTHER PUBLICATIONS

Photoresist Stripping with the UV-1 Dry Stripper, pp. 1-2, FIGS. 1-3.
UV Resist—Stripping for High—Speed and Damage—Free Process by Ozawa et al., pp. 125-128.
Zafonte et al., "UV/Ozone Cleaning for Organics Removal on Silicon Wafers", SPIE, vol. 470, Optical Microlithograph III: (1984), pp. 164-175.
Vig, "UV/Ozone Cleaning of Surfaces", pp. 235-254.

Primary Examiner—William A. Powell
Attorney, Agent, or Firm—Pollock, Vande Sande and Priddy

[57] ABSTRACT

An apparatus for rapidly stripping a photoresist which utilizes an oxidizing fluid such as ozone. A very thin layer of oxidizing fluid of four millimeters or less is flowed over the photoresist. The fluid flows at high velocity over the resist, while the resist is heated. Additionally, the resist may be irradiated with ultraviolet radiation at an irradiance of at least about 800 milliwatts/cm².

9 Claims, 6 Drawing Sheets

APPARATUS FOR PHOTORESIST STRIPPING

This application is a continuation-in-part of Application No. 895,102, filed Aug. 11, 1986.

The present invention is directed to an improved method and apparatus for photoresist stripping, and particularly, to a method and apparatus which results in rapid stripping times.

In the manufacture of integrated circuits, the technique of photolithography is frequently used. In the practice of this technique, a semiconductor wafer is coated with a photoresist, which is then exposed with ultraviolet radiation which is passed through a mask so that a desired pattern is imaged on the photoresist. This causes changes in the solubility of the exposed areas of the photoresist such that after development in a suitable solvent the desired pattern is fixed on the wafer, whereupon the photoresist is hard-baked to enable it to withstand subsequent processing.

In such subsequent processing, integrated circuit components which correspond to the desired pattern are formed by processes including plasma etching or ion implantation.

After the integrated circuit components are formed, it is desired to strip the photoresist from the wafer, which at this point has already served its useful purpose. The relative ease or difficulty with which the photoresist may be stripped depends on the degree to which physical and chemical changes have been induced in the resist during the specific plasma etching or ion implantation processes and on the degree to which the resist has been cross-linked. Thus, it is generally known that a significant degree of hard baking and to an even greater extent, the processes of plasma etching and ion implantation induce physical and chemical changes in the photoresist, so that stripping is particularly difficult.

In the prior art, the most common techniques which have been used for photoresist stripping are the use of wet solvent developers such as sulfuric acid-hydrogen peroxide solution, and the technique of plasma ashing. However, these have not proven to be altogether satisfactory, as wet solvent developers are difficult and dangerous to work with and have tended to result in surface contamination, while plasma ashing has characteristically been too slow and has sometimes resulted in electrical damage to the wafer.

A further technique for photoresist stripping comprises exposing the photoresist to an ozone-containing gaseous atmosphere while heating the substrate on which the photoresist layer is disposed. This method is disclosed in U.S. Pat. No. 4,431,592 wherein the ozone is transported across the photoresist in a reaction chamber while the substrate is heated to a temperature not to exceed 250° C.

In a related technique, known as "ultraviolet-ozone," the photoresist, which is a hydrocarbon-containing material, is subjected to ozone while it is irradiated with ultraviolet radiation containing spectral components below 300 nanometers. The combination of the ultraviolet and ozone results in oxidation of the resist, thereby stripping it by converting it to volatile by-products. Additionally, the substrate which carries the photoresist layer may be heated in connection with the ultraviolet-ozone method, although temperatures above 250°-300° C. have not previously been utilized.

The ozone and ultraviolet-ozone photoresist stripping techniques discussed above have shown initial promise in that they are clean and convenient to work with and result in fewer problems with surface contamination and electrical damage then prior art methods. However, these techniques have not met with significant commercial acceptance to date because as presently practiced, they are too slow for most photoresists, and may not even be capable of stripping resists which have been heavily ion implanted.

In accordance with the present invention, a very thin layer of oxidizing fluid of four millimeters or less is flowed over the resist at a rate to cause flow velocities over the resist of from 2–600 cm/sec. The resist may also be heated, and the short residence time which results from the use of the thin layer provides unusually short resist stripping times as compared with the prior art while avoiding device damage. In general, the higher the temperature, the faster the stripping rate, but use of the very thin layer provides a faster rate than the prior art at all temperatures. While the temperatures which can be used are limited by what the device can withstand, it has been found that with the use of the invention, temperatures substantially in excess of 300° C. can be used for some devices, while such temperatures were not possible with the prior art.

In the preferred embodiment of the invention, the fluid is a gas such as ozone, and the very thin layer is created by disposing a quartz plate a small distance above the photoresist to form a narrow gap. If ultraviolet radiation is additionally used, then the very thin layer of oxidizing fluid confined by the quartz plate minimizes ultraviolet absorption, and enables the use of a high irradiance, focussed ultraviolet source which can be located at some distance from the photoresist.

In the practice of the invention, with ozone used as the oxidizing fluid, the combination of high velocity ozone flow through a narrow gap results in faster stripping times than have heretofore been obtained with similar processes. A further enhancement may be obtained where the resist is additionally irradiated with ultraviolet radiation having significant spectral components beneath 300 nanometers.

It is thus an object of the present invention to provide a method and apparatus for rapidly stripping photoresists without damaging the devices on which the resists are disposed.

It is a further object of the invention to provide a method and apparatus which is particularly effective for stripping photoresists which are difficult to strip, such as those which have been ion implanted.

It is still a further object of the invention to utilize the technique of stripping with an oxidizing fluid with its attendant advantages, but to provide more rapid stripping with this technique than has been offered by the prior art.

It is still a further object of the invention to utilize a stripping technique which employs a high irradiance focussed ultraviolet light source which must be spaced from the resist.

The invention will be better understood by referring to the accompanying drawings, in which.

Figure 1:
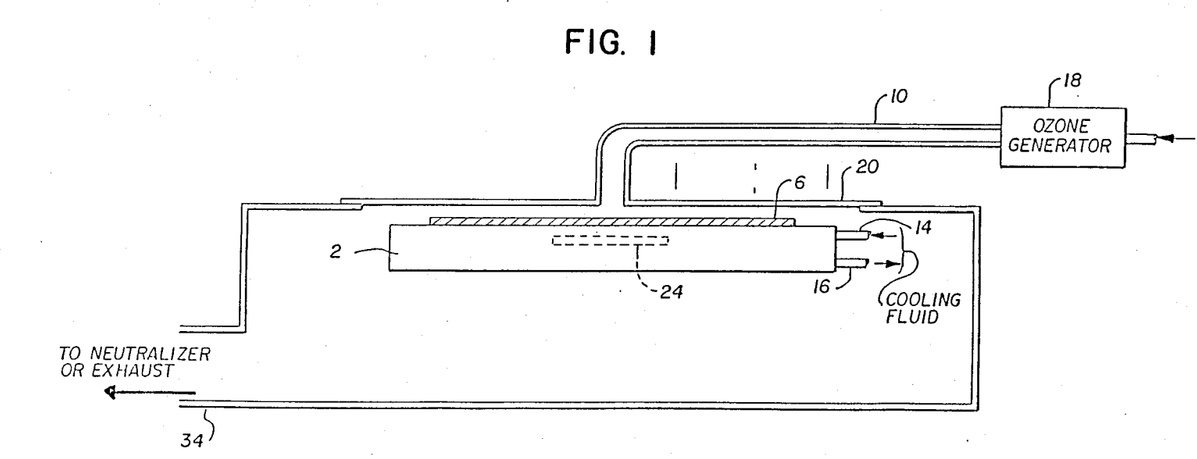
FIG. 1 is a schematic illustration of an embodiment of the invention.

Referring to FIG. 1, photoresist 6 which is to be stripped is coated on a substrate, for example, a silicon wafer, which is disposed on chuck 2.

In this embodiment, ozone is used as the oxidizing fluid, and in order to generate ozone, pure oxygen is fed to ozone generator 18, which may be of the silent discharge type. For example, the Griffin Techniques Corp. TC 0.5 C ozonizer is suitable.

The ozone is fed from conduit 10 through an opening in gap spacing element 20 to the area immediately over photoresist 6. Gap spacing element 20 is used to create a narrow gap above the photoresist, through which a very thin layer of ozone flows. In the preferred embodiment, element 20 is a flat plate made of quartz. The plate must be made of a substance which does not degrade upon exposure to ozone, and which does not cause excessively fast ozone decomposition. It may be possible to use materials other than quartz, so long as the materials possess the above characteristics.

The gap spacing element is in general located 4 millimeters or less from the resist, and in the embodiment of FIG. 1, wherein a plate having a single centrally located opening is used as the gap spacing element, a spacing of 2 millimeters or less is preferred. Additionally, with the embodiment of FIG. 1, for many resists the preferred spacing is about 0.5 millimeters. Applicants have discovered that in general the narrower the gap, the faster the stripping time, so gap spacing is a key parameter in the implementation of the invention.

The plate 20 is mounted so as to be the correct distance from the photoresist by conventional mounting means, which may include suitable spacers, and preferably the plate and chuck are in the shape of circular discs, so as to be congruent with the shape of the semiconductor wafer being stripped.

Ozone is fed to the narrow gap between the photoresist and plate at a flow rate sufficient to cause flow velocities in the gap which fall within the range of –600 cm/sec. The narrow gap facilitates attainment of such suitably high velocities. In an actual embodiment in accordance with FIG. 1, a flow rate of 2-5 standard cubic feet per hour (SCFH) and ozone at a 4% concentration in oxygen was utilized. A higher ozone concentration may permit a lower flow rate. Additionally, it is well known from related technology, e.g., plasma ashing, that the addition of small amounts of additional gases such as $N_2O$ or $CF_4$ can have synergistic effects.

The oxidizing fluid is removed from the area over the photoresist by an exhaust feeding conduit 34, which leads to a neutralizer, or is vented to the atmosphere, as by a smokestack.

Chuck 2 is hollow and is made of a good conductor of heat, such as aluminum. An electric resistance heater 24 is located inside of the chuck and is arranged to pre-heat the wafer to a temperature of from 200° C.–350° C. and preferably 250° C.–350° C.

The high velocity flow through the narrow gap ensures that the resist is continually exposed to fresh ozone, thus minimizing effects such as ozone recombination.

It should be noted that excessive flow velocity in the narrow gap results in cooling of the resist which may inhibit stripping, and the upper flow velocity is dependent upon the resist used as well as other process variables.

Figure 2:
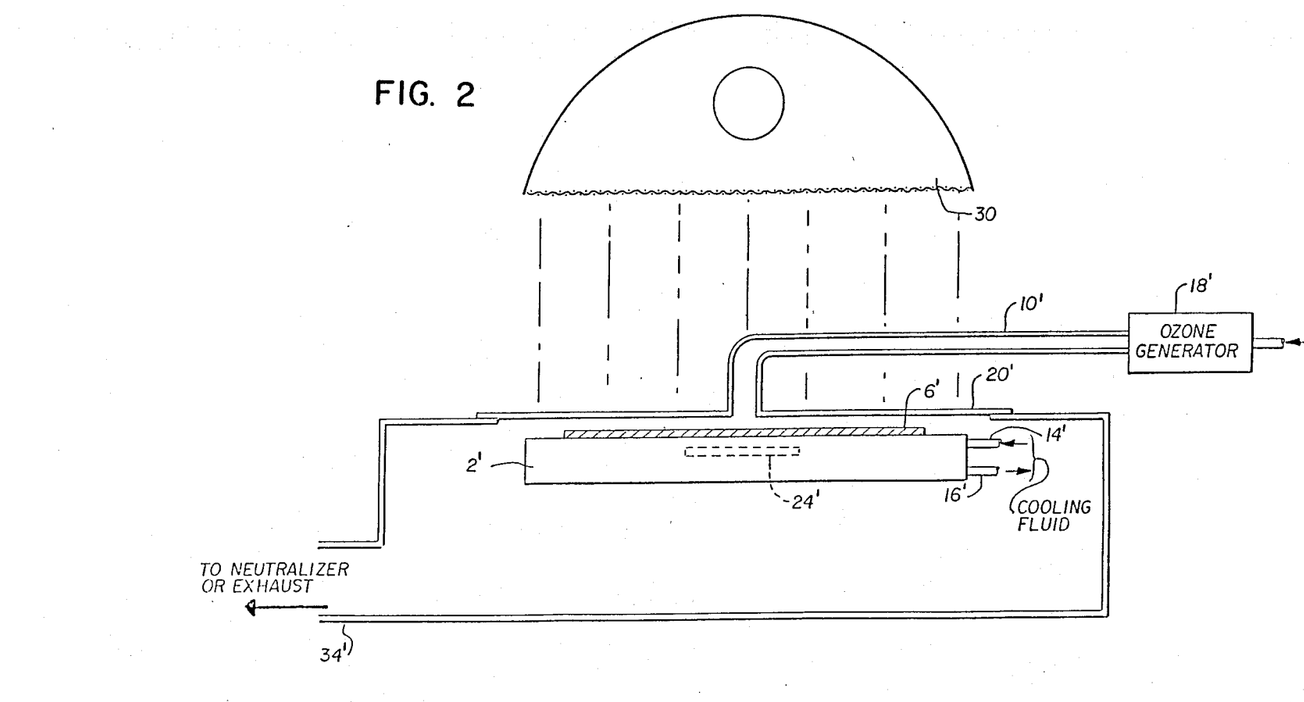
FIG. 2 is a schematic illustration of a further embodiment of the invention.

Referring to FIG. 2, a further embodiment of the invention is shown, wherein like numerals identify parts identical to those shown in FIG. 1. The embodiment of FIG. 2 is the same as FIG. 1 except that the resist is irradiated with ultraviolet radiation having significant spectral components beneath 300 nanometers while being exposed to ozone and heat. Exposure to UV may provide an enhancement of the stripping time, especially at gap widths of 2 millimeters or wider.

In FIG. 2 the radiation is provided by source 30, and the irradiance provided by this source should be at least 800 watts/cm$^2$. Use of the thin ozone layer in accordance with the invention minimizes absorption of the ultraviolet light and allows a high power, focussed electrodeless source to be used which must be separated from the photoresist for mechanical reasons and so that the photoresist can be disposed in the focal plane of the source to achieve the desired irradiance. Typically, a microwave powered electrodeless light source will be utilized to provide the necessary irradiance.

A light source which has been found to perform particularly well is the M 150 PC Irradiator manufactured by Fusion Systems Corp. This source utilizes a spherical bulb and segmented reflector using the principle described in U.S. Pat. No. 4,683,525 to provide substantially uniform radiation on the wafer. Additionally, it has been found that for the present application, a retaining ring of reflecting material located beneath mesh 30 and canted 5° from the perpendicular towards the outside may increase uniformity still further.

Figure 11:
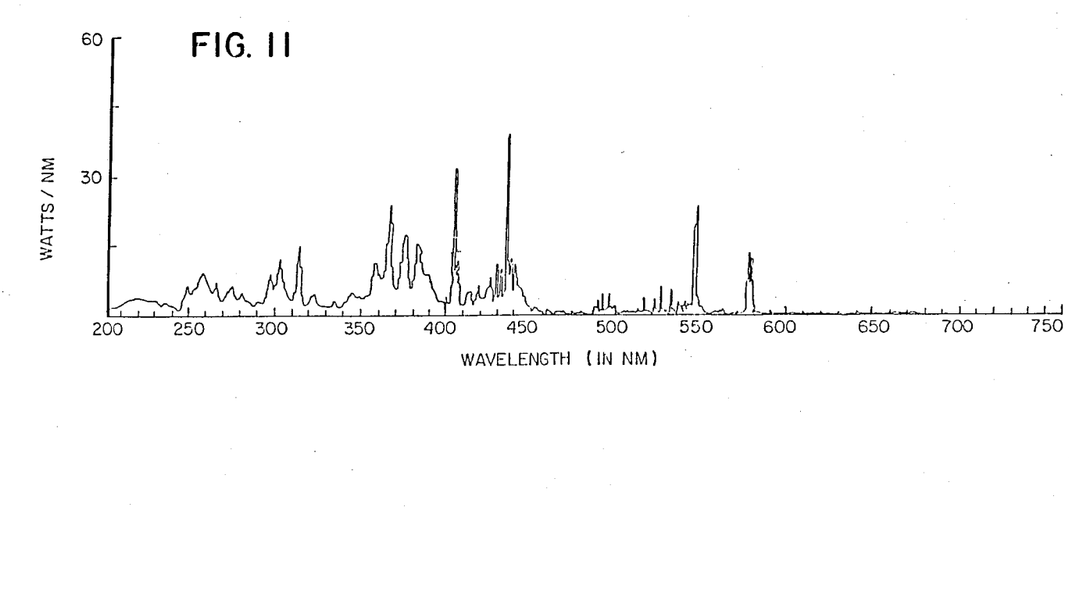
FIG. 11 is an illustration of a preferred ultraviolet spectrum which the light source may use.

A preferred spectrum for the ultraviolet source is shown in FIG. 11, and it is noted that significant spectral components below 300 nanometers are present. While other specific spectra including deep UV wavelengths below 300 nanometers will also work advantageously, the illustrated spectrum was found to work particularly well.

In a further embodiment of the invention, the oxidizing fluid used is liquid $H_2O_2$ which is squirted onto the center of the wafer by a liquid dispenser. The wafer is disposed on a spinner platform which rotates the wafer at a selected speed, whereby the centrifugal force causes the very thin layer of liquid to spread out over the wafer, so that no quartz plate is necessary. In this embodiment, the thickness of the fluid layer is controlled by the speed of rotation of the spinner. As described above, the photoresist is also irradiated with ultraviolet radiation which includes deep UV wavelengths, and the wafer may also be heated, although with this embodiment suitably fast stripping rates may also be obtained at ambient temperature.

With the embodiments of FIGS. 1 and 2, after stripping is effected, it is desired to rapidly cool the chuck, so as to maintain the wafer at elevated temperature for as short a time as possible to avoid damage to the wafer, and to facilitate subsequent wafer transport operations. One way of accomplishing cooling is to pass a cooling fluid, for example, de-ionized water through a channel in the chuck (not illustrated). This would be a continuous channel, and in FIG. 1, cooling fluid is fed in via conduit 14 and exits via conduit 16. Cooling is by conduction and is accomplished rapidly since the chuck is made of a good conductor.

Figure 12:
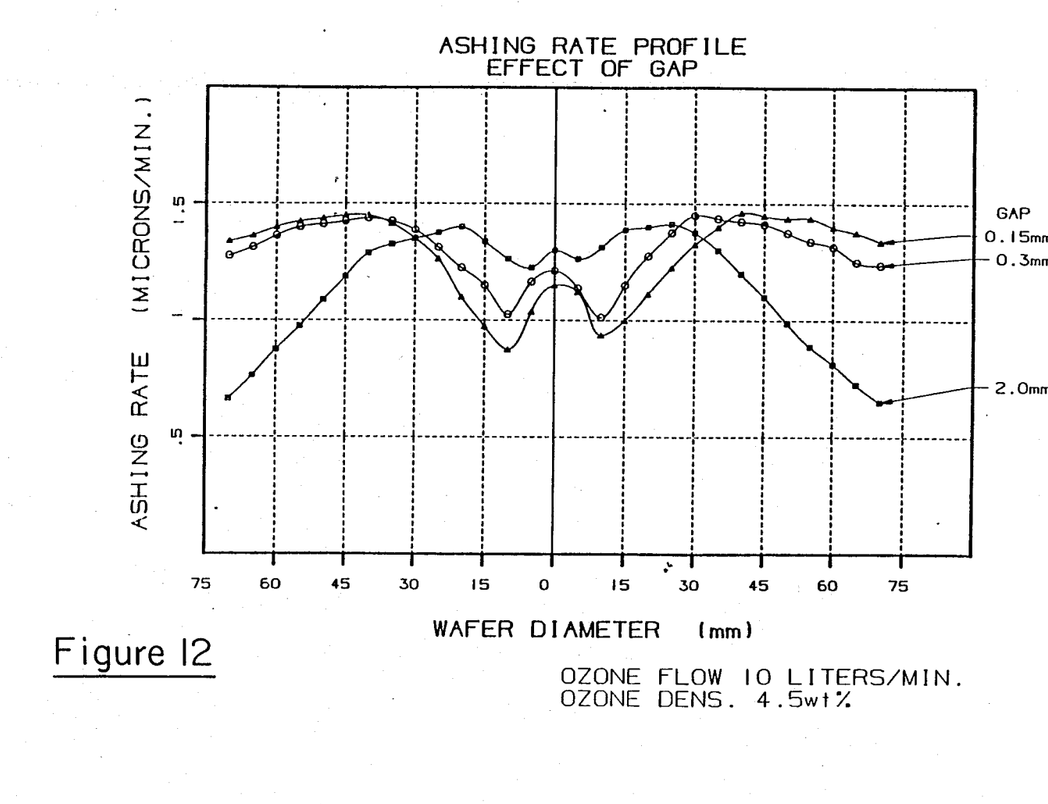
FIG. 12 is a graph which shows the dependence of the stripping or ashing rate on the width of the narrow gap.

FIG. 12 shows the dependency of the stripping rate on the width of the narrow gap. As can be seen, it has been found that for wafers of practical size, higher stripping rates are obtained at narrower gaps.

Figure 13:
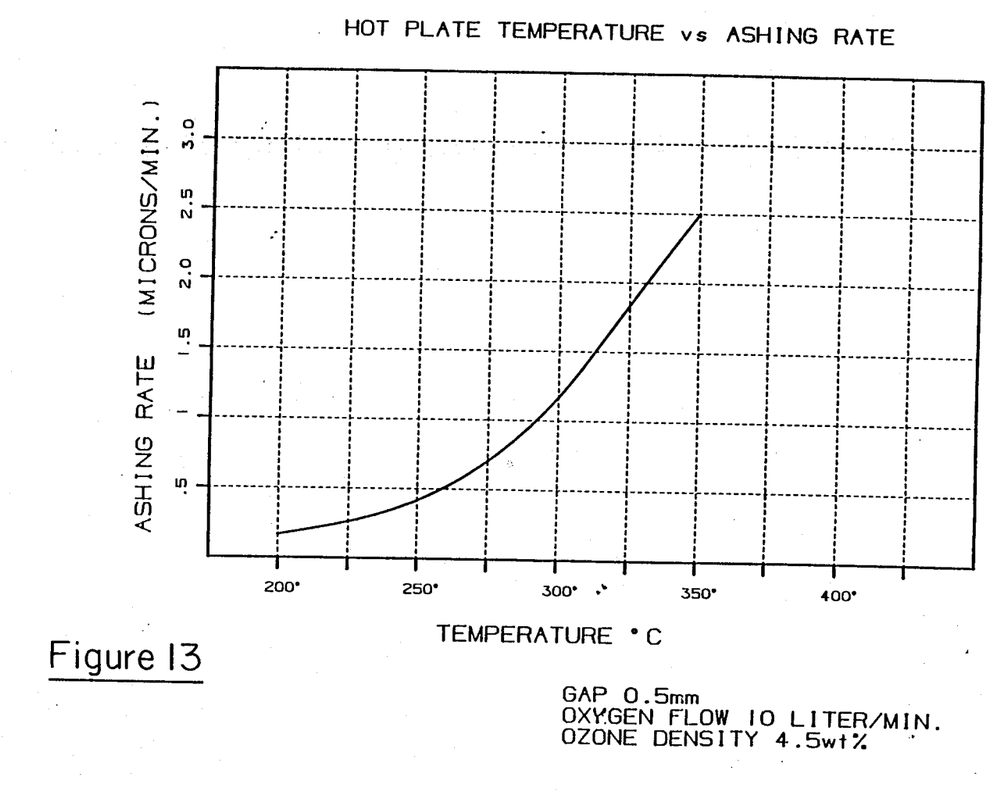
FIG. 13 is a graph of the stripping or ashing rate as a function of hot plate temperature.

FIG. 13 shows the dependency of the stripping rate on hot plate temperature, and illustrates that the stripping rate increases with increasing temperature. It is thus desirable to strip at higher temperatures, and the limiting factors are the maximum temperature that the resists can withstand without suffering damage and the re-combination characteristics of ozone. In fact, the use of the very thin layer of the invention allows some resists to be stripped at temperatures which are substantially in excess of 300° C. without becoming damaged, which was not possible in the prior art. At the conventional temperatures of about 250° C. utilized in the prior art, the very thin layer results in faster stripping times and in the ability to strip hard to strip resists in shorter times.

In embodiments of the invention which utilize UV radiation, increasing the ultraviolet irradiance of the source to 800 milliwatts/$cm^2$ and significantly higher up to 2 watts/$cm^2$ or more may reduce the stripping time, allowing higher substrate temperatures to be used without device damage.

The following are examples demonstrating how the invention has been implemented in specific cases.

EXAMPLE I

An apparatus as shown in FIG. 1 was used to strip a Shipley 1400 Series photoresist of thickness 1.5 microns which was ion implanted and UV baked.

The wafer was pre-heated to 330° C. and reached a peak temperature during stripping of 331° C. A gaseous mixture containing 4% ozone in oxygen was fed to a narrow gap of 0.5 mm over the resist at a flow rate of 4 SCFH.

The resist was 98% stripped over a 4 inch diameter in 3 minutes.

EXAMPLE II

An apparatus as shown in FIG. 2 was used to strip a Shipley 1400 Series photoresist of thickness 1.5 microns which was heavily ion implanted.

The wafer was pre-heated to 320° C. A gaseous mixture containing 3%-4% ozone in oxygen was fed to a narrow gap of 2 mm or less over the resist at a rate of 3-4 SCFH and the resist was exposed to ultraviolet radiation (200-420 nm) at an irradiance of approximately 1450 milliwatts/$cm^2$.

The resist was completely stripped in 2.5 minutes.

EXAMPLE III

An apparatus as shown in FIG. 2 was used to strip a PMMA photoresist of thickness 1 micron which was hard baked.

The wafer was pre-heated to 320° C. A gaseous mixture containing 3%-4% ozone in oxygen was fed to a narrow gap of 2 mm or less over the resist at a rate of 3-4 SCFH and the resist was exposed to ultraviolet radiation at an irradiance of 1450 milliwatts/$cm^2$.

The resist was completely stripped in 30-45 seconds. substrate and said plane

EXAMPLE IV

An OFPR 800 resist of thickness 1 micron which was hard baked was stripped using a gap spacing element having a large number of fluid supply openings evenly distributed over the element.

The wafer was pre-heated to 300° C. A gaseous mixture containing 3.6% ozone in oxygen was fed to a gap of 4 mm at a rate of about 16 SCFM.

The resist was stripped at a rate in excess of 0.5 micron per minute.

As mentioned above, some resists cannot withstand temperatures of 300° C. and above, and these are stripped with ozone as the oxidizing fluid at temperatures of 200° C. and above, preferably 250° C.-300° C.

It should be appreciated that as performed in an actual process line, the practice of the invention would be automated. Thus wafers to be stripped would be automatically transported to the chuck, where heating to a predetermined temperature and exposure to the oxidizing fluid would ensue.

Further, while the embodiment illustrated in FIG. 1 shows a quartz plate 20 having a single centrally located fluid supply port or opening, other arrangements are possible and may be more desirable.

In this regard, it is desired to provide a layer of oxidizing fluid of uniform thickness having a uniform flow rate, which is not contaminated with constituents which are formed by the chemical reactions occurring such as carbon dioxide and water vapor.

Thus, in the embodiment of FIG. 2, the ozone layer tends to dilute as it flows from the center to the periphery of the quartz plate, while the flow velocity becomes smaller and the ozone tends to become contaminated with carbon dioxide and water vapor.

Figure 3:
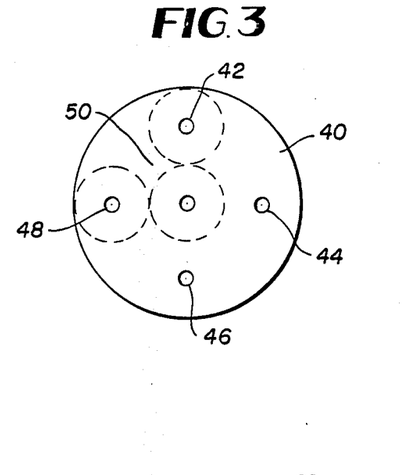
FIGS. 3 and 4 show an embodiment of the invention utilizing a gap spacing element having multiple ports or openings.

Referring to FIG. 3, an embodiment is illustrated wherein quartz plate 40 has multiple ports or openings 42, 44, 46 and 48. This arrangement results in an ozone layer of more uniform thickness at a more uniform flow velocity with less overall and localized contamination of the fluid. With this arrangement, a lower ozone velocity than in the arrangement of FIG. 1 may be used.

Figure 4:
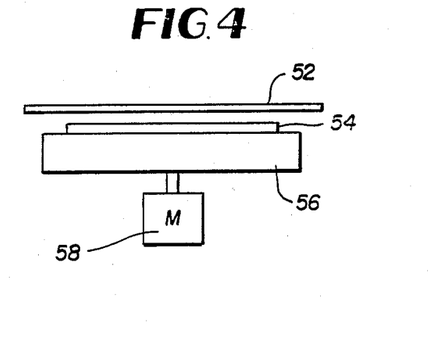

In the arrangement of FIG. 3, there may be null areas between the ports, for example, at the area denoted by reference numerial 50 in FIG. 3. These null areas may be compensated for to a significant degree by rotating the photoresist. In FIG. 4 an embodiment is shown wherein chuck 56 is rotated by motor 58. In such an embodiment, slip joints would be provided to accommodate fluid transfer while rotating, while slip rings would accommodate transfer of electrical currents.

Figure 5:
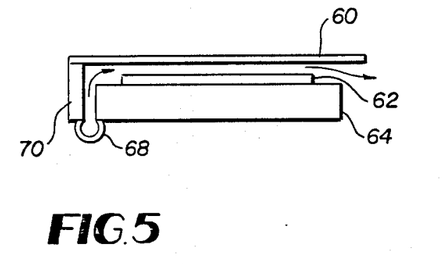
FIGS. 5 and 6 show an embodiment of the invention utilizing a gap spacing element which is fed with oxidizing fluid from an edge of the plate.

In FIG. 5, an embodiment which is edge fed is depicted, wherein quartz plate 60 is rectangular in shape and wherein oxidizing fluid is fed inside baffle 70 by conduit 68 which runs along the edge of plate 60. Conduit 68 is elongated into the plane of the paper, and includes an opening running lengthwise along the conduit. Oxidizing fluid is fed to the conduit and is fed through the opening therein to the gap between quartz plate 60 and the photoresist on wafer 62.

The density and flow velocity of the oxidizing fluid in the edge flow embodiment of FIG. 5 tends to be quite uniform, but the fluid tends to get contaminated due to the relatively large distance which it traverses.

Figure 6:
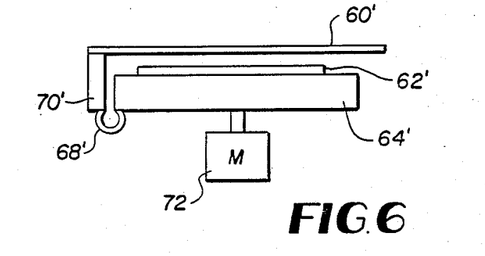

This can be compensated for by rotating the photoresist, and FIG. 6 shows motor 72 for rotating chuck 64'.

Figures 7, 8, 9:
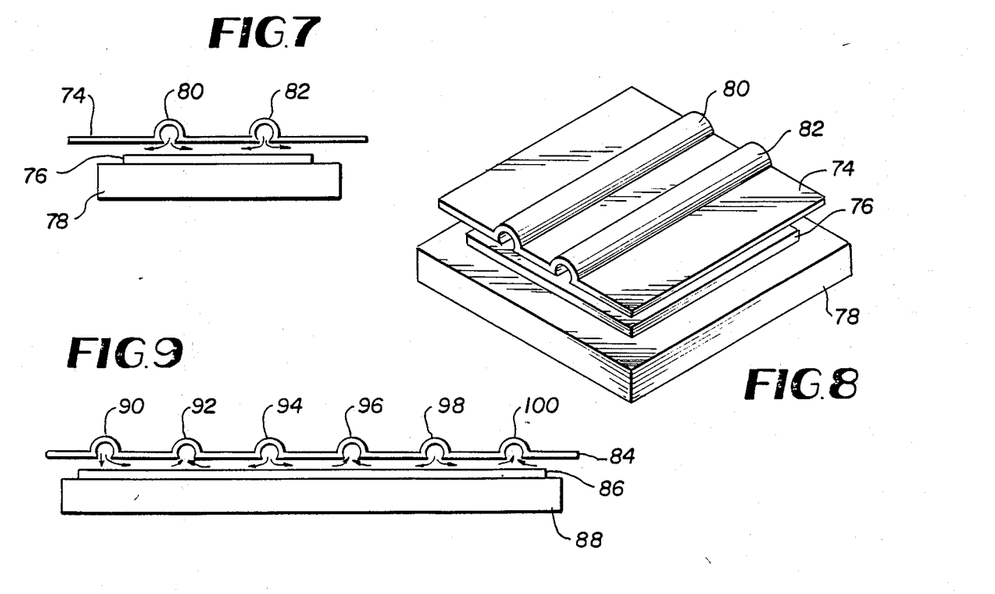
FIGS. 7 and 8 show an embodiment of the invention utilizing a gap spacing element having multiple parallel conduits for supplying oxidizing fluid associated therewith.
FIG. 9 shows an embodiment of the invention utilizing a gap spacing element having conduits associated therewith wherein alternate conduits supply oxidizing fluid and conduits between such alternate conduits evacuate oxidizing fluid.

In FIGS. 7 and 8, an embodiment utilizing parallel quartz conduits for feeding the oxidizing fluid is shown. Thus, fluid conduits 80 and 82 are depicted as being integrally formed with quartz plate 74 while the fluid flow is shown by the arrows in FIG. 7.

In FIG. 9, a further embodiment is shown wherein alternate quartz conduits integrally formed with the quartz plate supply fluid while those conduits between the alternate conduits evacuate fluid from the area between the plate and the photoresist. Evacuation of the fluid after it has travelled only a short distance results in a relatively low level of contamination.

To avoid possible nulls as well as shadowing caused by the quartz conduits, it may be desirable to rotate the photoresist in the embodiments of FIGS. 7, 8 and 9.

It is noted that instead of rotating the chuck in the above described embodiments, a similar result may be obtained by oscillating the chuck.

Figure 10:
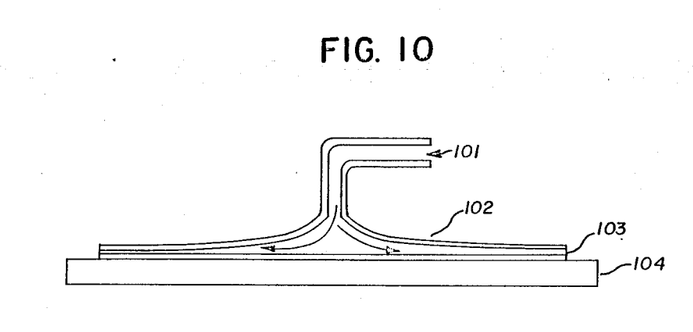
FIG. 10 shows an embodiment of the invention utilizing a tapered gap spacing element.

Referring to FIG. 10, a further embodiment is shown wherein the fluid confining member 102 is tapered to reduce the inlet velocity and increase the velocity towards the outside, where it is needed to counter dilution and contamination of the fluid.

A further embodiment which may be utilized is one which employs a mesh as the gap spacing element. This is similar in principle to FIG. 3, except uses many more fluid supply openings per unit area.

There thus has been described an apparatus and process for attaining rapid stripping of photoresists.

While the invention has been disclosed in connection with the use of ozone and hydrogen peroxide, it should be understood that it may be possible to use other oxidizing fluids, and the term "oxidizing fluid" in the following claims should be understood to cover substances including ozone, oxygen, chlorine, fluorine, iodine and hydrogen peroxide.

Also, as mentioned, the terms "ultraviolet radiation" and "ultraviolet" should be understood to mean radiation at 200–420 nm.

While the invention has been described in connection with stripping of photoresists, it may find use in the removal of organic substance generally.

Additionally, while the invention has been described in connection with illustrative and preferred embodiments, variations within the scope of the invention may occur to those skilled in the art, and it is to be understood that the invention is to be limited only by the claims appended hereto and equivalents.

We claim:

1. An apparatus for stripping a layer of photoresist from a substrate made of a different material on which said photoresist layer is disposed, comprising,
    means for holding said substrate on which said photoresist layer is disposed,
    means for disposing a plane surface adjacent said photoresist layer but separated therefrom so as to create a narrow gap of four millimeters or less between said plane surface and said photoresist layer,
    means for feeding oxidizing fluid to said narrow gap to cause a thin layer of said oxidizing fluid of four millimeters or less to flow over said photoresist layer,
    means for maintaining said means for holding said substrate and said plane surface in stationary relationship to each other while said stripping occurs, and
    means for heating said substrate to a temperature over 200° C.

2. The apparatus of claim 1 wherein said means for heating heats said substrate to a temperature of about 260° C. or above.

3. The apparatus of claim 2 wherein said means for heating heats said substrate to a temperature above 300° C.

4. The apparatus of claim 1 wherein said means for heating heats said substrate to a temperature of about 320° C. or above.

5. The apparatus of claim 1 wherein said narrow gap is about two millimeters or less.

6. The apparatus of claim 1 wherein said narrow gap is less than about 0.6 millimeters.

7. The apparatus of claim 1 wherein said oxidizing fluid is a gaseous medium containing ozone.

8. An apparatus for stripping a layer of photoresist from a substrate made of a different material on which said photoresist layer is disposed, comprising,
    means for holding said substrate on which said photoresist layer is disposed,
    means for disposing a plane surface adjacent said photoresist layer but separated therefrom so as to create a narrow gap of four millimeters or less between said plane surface and said photoresist layer,
    means for supplying ozone at a concentration of 4% or greater,
    means for feeding said ozone to said narrow gap to cause a thin layer of said oxidizing fluid of four millimeters or less to flow over said photoresist layer,
    means for maintaining said means of holding said substrate and said plane surface in stationary relationship to each other while said stripping occurs, and
    means for heating said substrate to a temperature over 200° C.

9. The apparatus of claim 1 or 8, further comprising means for exposing the photoresist layer to ultraviolet radiation of an irradiance of at least 800 milliwatts/cm$^2$ while said substrate is heated and said oxidizing fluid is transported over said photoresist layer, said means for exposing comprising a focussed ultraviolet source.

* * * * *